United States Patent
Ghosh et al.

(10) Patent No.: US 9,728,241 B2
(45) Date of Patent: Aug. 8, 2017

(54) NON-VOLATILE FLIP-FLOP WITH ENHANCED-SCAN CAPABILITY TO SUSTAIN SUDDEN POWER FAILURE

(71) Applicants: Swaroop Ghosh, Tampa, FL (US); Anirudh Srikant Iyengar, Tampa, FL (US); Jae-Won Jang, Tampa, FL (US)

(72) Inventors: Swaroop Ghosh, Tampa, FL (US); Anirudh Srikant Iyengar, Tampa, FL (US); Jae-Won Jang, Tampa, FL (US)

(73) Assignee: UNIVERSITY OF SOUTH FLORIDA, Tampa, FL (US)

( * ) Notice: Subject to any disclaimer, the term of this patent is extended or adjusted under 35 U.S.C. 154(b) by 0 days.

(21) Appl. No.: 15/144,322

(22) Filed: May 2, 2016

(65) Prior Publication Data
US 2016/0322093 A1 Nov. 3, 2016

Related U.S. Application Data

(60) Provisional application No. 62/155,276, filed on Apr. 30, 2015.

(51) Int. Cl.
*G11C 11/00* (2006.01)
*G11C 11/16* (2006.01)
*G11C 14/00* (2006.01)

(52) U.S. Cl.
CPC ...... *G11C 11/1675* (2013.01); *G11C 14/0081* (2013.01)

(58) Field of Classification Search
CPC ... G11C 14/0081; G11C 11/16; G11C 14/009; G11C 13/0002; G11C 11/1675;
(Continued)

(56) References Cited

U.S. PATENT DOCUMENTS

2014/0313843 A1* 10/2014 Nebashi ................. G11C 5/148
365/227

OTHER PUBLICATIONS

Yamamoto et al., "Nonvolatile Delay Flip-Flop on Spin-Transistor Architecture and Its Power-Gating Applications," Japanese Journal of Applied Physics, Sep. 6, 2010, pp. 090204-1 through 090204-3, Rapid Communication.
(Continued)

*Primary Examiner* — Thong Q Le
(74) *Attorney, Agent, or Firm* — Saliwanchik, Lloyd & Eisenschenk

(57) ABSTRACT

Non-volatile flip-flops (NVFFs) based circuitries and schemes that incorporate magnetic tunnel junctions (MTJs) are provided to ensure fast data storage and restoration from an intentional or unintentional power outage. The NVFFs based circuitries and schemes also include enhanced scan mode testing capability by exploiting the nonvolatile latch to function as hold latch for delay testing. The NVFFs based circuitries and schemes eliminate additional write drivers, and may operate at an operation frequency of, for example, up to 2 GHz at a supply voltage of 1.1 V and with 0.55 pJ of energy consumption. A near uniform write latency can be achieved through transistor sizing, given write asymmetry of MTJs. NVFFs based circuitries and schemes incorporating data-dependent power gating circuitries can be used to mitigate high static currents generated during retention and back-to-back writing of identical input data.

17 Claims, 8 Drawing Sheets

(58) Field of Classification Search
CPC ............... G11C 11/18; G11C 13/0069; G11C 11/1673; G11C 11/1693; G11C 13/0007; G11C 11/005; G11C 11/401; G11C 11/4085; G11C 11/4125
USPC .......... 365/158, 148, 154, 189.05, 171, 173, 365/227, 229, 163, 177, 100, 149, 189.11, 365/194, 201
See application file for complete search history.

(56) References Cited

OTHER PUBLICATIONS

Kwon et al., "SHE-NVFF: Spin Hall Effect-Based Nonvolatile Flip-Flop for Power Gating Architecture," IEEE Electron Device Letters, Apr. 2014, vol. 35, No. 4, pp. 488-490.

Zhao et al., "Spin-MTJ based Non-Volatile Flip-Flop", Proceedings of the 7$^{th}$ IEEE International Conference on Nanotechnology, Aug. 2-5, 2007, Hong Kong, pp. 399-402.

Sakimura et al., "Nonvolatile Magnetic Flip-Flop for Standby-Power-Free SoCs," IEEE Journal of Solid-State Circuits, Aug. 2009, vol. 8, No. 8, pp. 2244-2250, Japan.

Goel et al., "Low-Overhead Design of Soft-Error-Tolerant Scan Flip-Flops with Enhanced Scan Capability*," IEEE, 2006, pp. 665-670.

Fong et al., "KNACK: A Hybrid Spin-Charge Mixed-Mode Simulator for Evaluating Different Genres of Spin-Transfer Torque MRAM Bit-cells," IEEE, 2011, pp. 51-54.

Zhang et al., "Asymmetry of MTJ Switching and Its Implication to STT-RAMM Designs," EDAA, 2012.

Khan et al., "Dielectric breakdown in Co-Fe-B/MgO/Co-Fe-B magnetic tunnel junction," Journal of Applied Physics, 2008, vol. 103, pp. 123705-1 through 123705-5.

Predictive Technology Model [onling], retrieved on May 16, 2016, retrieved from the internet, URL: http://ptm.asu.edu/.

Srinivasan, "All Spin Logic: Modeling Multi-Magnet Networks Interacting via Spin Currents", PhD Dissertation, Purdue University, 2012.

Chabi et al., "Ultra Low Power Magnetic Flip-Flop Based on Checkpointing/Power Gating and Self-Enable Mechanisms," IEEE Transactions on Circuits and Systems-I: Regular Papers, Jun. 2014, vol. 61, No. 6, pp. 1755-1765.

* cited by examiner

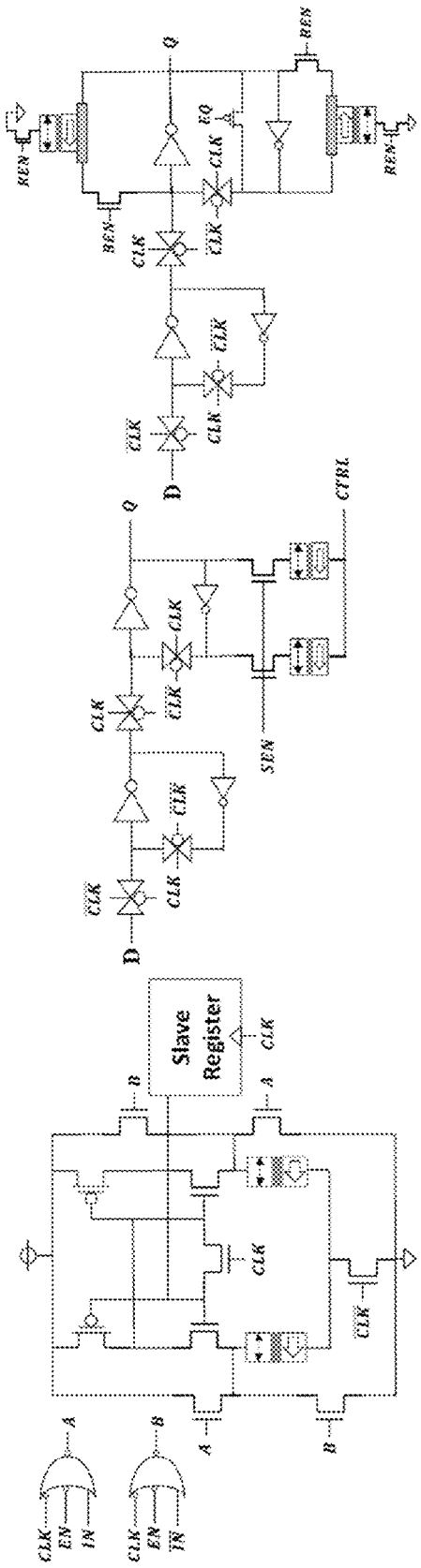

NON-VOLATILE FLIP-FLOP WITH ENHANCED-SCAN CAPABILITY TO SUSTAIN SUDDEN POWER FAILURE

CROSS-REFERENCE TO A RELATED APPLICATION

This application claims the benefit of U.S. Provisional Application Ser. No. 62/155,276, filed Apr. 30, 2015, the disclosure of which is hereby incorporated by reference in its entirety, including all figures, tables and drawings.

This invention was made with government support under Grant Numb CNS1441757 awarded by The National Science Foundation. The government has certain rights in the invention.

BACKGROUND OF THE INVENTION

Mobile devices such as smartphones, laptops and iPads demand ultra-low power and instant-ON (ION) user experience after hibernation or power failure. The quick recovery of data from power down condition is of critical importance to provide ION experience. Conventional volatile systems require storage of processor states and cached data in off-chip non-volatile memory before hibernation and power down. The restoration is dominated by access latency from off-chip memory. Moreover, they cannot handle sudden power failures. With the introduction of non-volatile memory in lower level cache and memory, it is possible to restore the processor state quickly. However, the restoration is still contingent upon time to restart the pipeline.

State retentive sequential elements are gaining popularity as they can store the processor state before power outage, eliminating the need to restart the pipeline from scratch. This capability can potentially cut down the ON time drastically.

Several nonvolatile flip-flops (NVFFs) based circuitry designs have been widely investigated to this effect. NVFF saves the current logic state into its NV storage element before the power gating. After wake up, the data saved in the nonvolatile storage is restored to the flip-flop to resume normal operations.

A primary challenge in conventional NVFF design is the lack of support to handle sudden power outage. The NVFF circuitry shown in FIG. 1(a) incorporates two additional write driver circuitries to store data into magnetic tunnel junctions (MTJs). Nevertheless, this design is associated with increased area and power overhead. Although the NVFF circuitry shown in FIG. 1(b) provides a more power-efficient solution, incorporating the MTJs in the operational paths incurs delay overhead that limits the operating frequency of the flip-flops. A spin-Hall effect (SHE) based NVFF for energy-efficiency is shown in FIG. 1(c). However, a delay of about 30 ns for storing the data in MTJs makes it impractical for per-cycle data backup. Other previously proposed designs involve high delay and power overhead when resistances of the MTJs are sensed by a sense amplifier and forwarded to a slave circuitry.

BRIEF SUMMARY OF THE INVENTION

There continues to be a need in the art for improved designs and techniques to ensure fast data restoration from intentional and unintentional power outages with increased operation frequencies and reduced energy consumption.

Embodiments of the subject invention pertain to using enhanced scan nonvolatile flip flops (ES-NVFF) based circuitry to retain current logic states of the circuitry during power down stage.

According to an embodiment of the invention, a base ES-NVFF circuitry can include a master latch, a slave latch, and a nonvolatile (NV) latch that comprises a plurality of MTJs. Control signals can be input to the base ES-NVFF circuitry to control four operation modes including a normal mode, an enhanced scan mode, s store mode, and a restore mode of the base ES-NVFF circuitry. Writes of the MTJs can occur only during negative phases of clock cycles of the base ES-NVFF circuitry. Moreover, writes of the two MTJs can take place in series. A switching of resistance of a second MTJ can be started after a switching of resistance of a first MTJ is finished. Thus, the store mode operations of MTJ1 and MTJ2 can be accomplished sequentially and operational frequencies of MTJ1 and MTJ2 of the NV can latch depend upon write latency.

According to another embodiment of the invention, a high performance ES-NVFF (HPES-NVFF) circuitry can allow MTJ1 and MTJ2 to be written in parallel, thereby increasing the operation frequency. By providing separate write drivers to MTJ1 and MTJ2, the write operation of MTJ1 and MTJ2 can be performed during the entire CLK cycle. Thus, as much as five times frequency benefit can be obtained with the HPES-NVFF circuitry compared to the base ES-NVFF circuitry.

According to another embodiment of the invention, data-dependent power-gated high performance enhanced scan NVFF (PGHPES-NVFF) circuitry and scheme can be provided to eliminate static current and unnecessary write power by shutting off certain inverters when there is no change in the input of the circuitry. This can be achieved by comparing a current state of the circuitry with a previous state of the circuitry. If the states are unchanged, the write drivers can be disconnected from the supply voltage using gating transistors.

According to one aspect of the invention, an analysis of design metrics of the HPES-NVFF circuitry can be performed. The HPES-NVFF circuitry can be analyzed with respect to supply voltage scaling and inherent asymmetry in write latency when switching between the two MTJ states, namely, parallel-to-antiparallel (P to AP) and antiparallel to parallel (AP to P). Moreover, analysis of an impact of static power during retention and a back-to-back writing of the same data can be performed.

According to another aspect of the invention, areas of footprints of the base ES-NVFF circuitry, the HPES-NVFF circuitry, and the PGHPES-NVFF circuitry can be compared with respect to a master-slave flip flop (MSFF) circuitry, a nonvolatile D flip flop (NVDFF) circuitry, and an enhanced scan flip flop (ESFF) circuitry. By implementing a parallel write operation with an area of 2 times, a performance benefit of up to 2 GHz can be achieved by the HPES-NVF circuitry. With addition of XOR gates, an inverter, and gating transistors, a significant reduction in leakage energy can also be achieved by the PGHPES-NVFF circuitry.

BRIEF DESCRIPTION OF THE DRAWINGS

FIG. 1(a) shows a schematic diagram of a spin-magnetic tunnel junction (MTJ) based nonvolatile flip flops (NVFF) circuitry, according to prior art.

FIG. 1(b) shows a schematic diagram of a nonvolatile D flip flop (NVDFF) circuitry, according to prior art.

FIG. 1(c) shows a schematic diagram of a spin Hall effect nonvolatile flip flops (SHE-NVFF) circuitry, according to prior art.

DETAILED DISCLOSURE OF THE INVENTION

Embodiments of the subject invention pertain to using enhanced scan nonvolatile flip flops (ES-NVFF) based circuitry to retain current logic states of the circuitry during power down stage.

In many embodiments, enhanced scan flip-flops (ES-NVFF) circuitry can be used as a sequential design-for-test technique to enable two-pattern delay testing. The ES-NVFF circuitry can include store and restore functionalities in hold latches. Embodiments of the subject invention include a base enhanced scan NVFF (ES-NVFF) circuitry and scheme, a high performance enhanced scan NVFF (HPES-NVFF) circuitry and scheme, and a data-dependent power-gated high performance enhanced scan NVFF (PGHPES-NVFF) circuitry and scheme.

In an embodiment, a state retaining circuit can include a master latch, a slave latch coupled to the master latch, and a non-volatile (NV) latch coupled to the master latch and coupled in parallel to the slave latch. The NV latch can include a plurality of magnetic tunnel junctions (MTJs) coupled in parallel, a plurality of back-to-back inverts coupled to the MTJs, and at least one transmission gate coupled to the MTJs.

Following are examples that illustrate circuitries and schemes for practicing the invention. These examples should not be construed as limiting.

Example 1: Base ES-NVFF

Figure 2A:
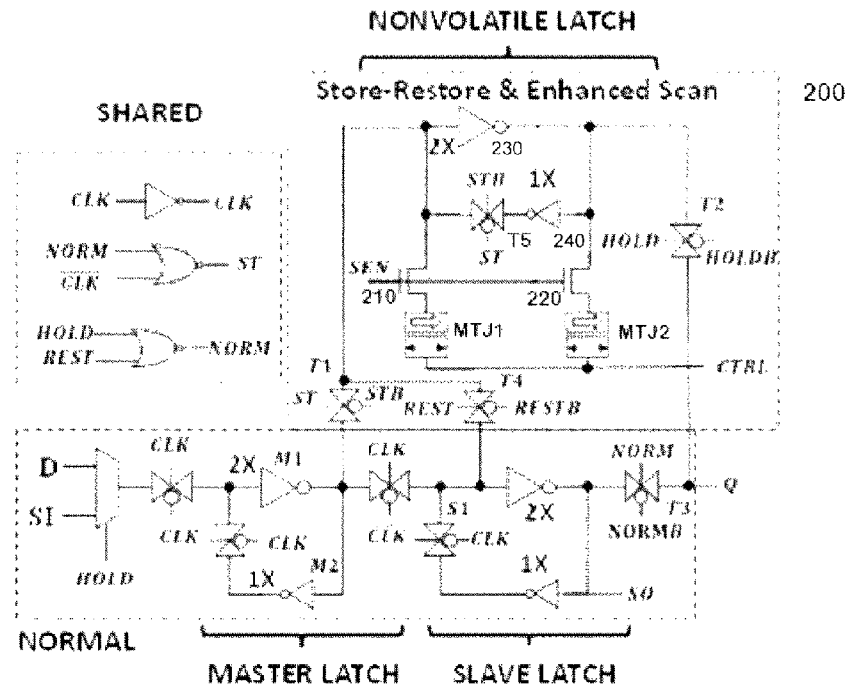
FIG. 2(a) shows a schematic diagram of a base enhanced scan flip-flops (ES-NVFF) circuitry, according to an embodiment of the present invention.

FIG. 2(a) illustrates a base enhanced scan flip-flops (ES-NVFF) circuitry 200, according to an embodiment of the present invention. The base ES-NVFF circuitry 200 can include a master latch, a slave latch, and a nonvolatile (NV) latch. The slave latch and the NV latch can be coupled in parallel and can both be coupled to the master latch. An output of the master latch can be fed to the slave latch as well as to the NV latch.

The NV latch can include two magnetic tunnel junctions (MTJs; MTJ1 and MTJ2), a first and a second access transistor 210 and 220, transmission gates T1, T2, T4, and T5, and back-to-back inverters 230 and 240. MTJ1 and MTJ2 can each include at least a free layer and a fixed layer.

The NV latch can be coupled to the master latch via the transmission gate T1, wherein an output of the master latch is fed to the NV latch via the transmission gate T1. The transmission gate T2 output of the NV latch can be coupled to an output end of the slave latch. The NV latch can be coupled to the slave latch via the transmission gate T4 which is controlled by a REST signal.

Moreover, the NV latch can include a first current path 1 and a second current path 2 coupled in parallel. The first current path 1 can include the first access transistor 210 and MTJ1 that are coupled in series. The second current path 2 can include the second access transistor 220 and MTJ2 that are coupled in series. The back-to-back inverters 230 and 240 and the transmission gate T5 can be coupled between the first current path 1 and the second current path 2.

The transmission gate T1 can be controlled by an ST signal. The transmission gate T2 can be controlled by a HOLD signal. The transmission gate T5 can be controlled by the ST signal. The gate terminals of the first access transistor 210 and the second access transistor 220 are commonly controlled by an SEN signal. The drain of the first access transistor 210 can be coupled to one end of MTJ1 adjacent to the free layer of MTJ1. The drain of the second access transistor 220 can be coupled to one end of MTJ2 adjacent to the free layer of MTJ2. The other end of MTJ1 adjacent to the fixed layer of MTJ1 and the other end of MTJ2 adjacent to the fixed layer of MTJ2 are commonly controlled by a CTRL signal.

The ST signal for controlling the NV latch and an NORM signal for controlling the slave latch can be derived from combinational logics of shared HOLD, REST, and clock CLK signals. These shared signals can be toggled to control four operation modes including a normal mode, an enhanced scan mode, a store mode, and a restore mode of the base ES-NVFF circuitry 200. In an embodiment, writes of the MTJs only occur during negative phases of clock cycles of the base ES-NVFF circuitry 200 and writes of the two MTJs take place in series as described below.

Figure 2B:
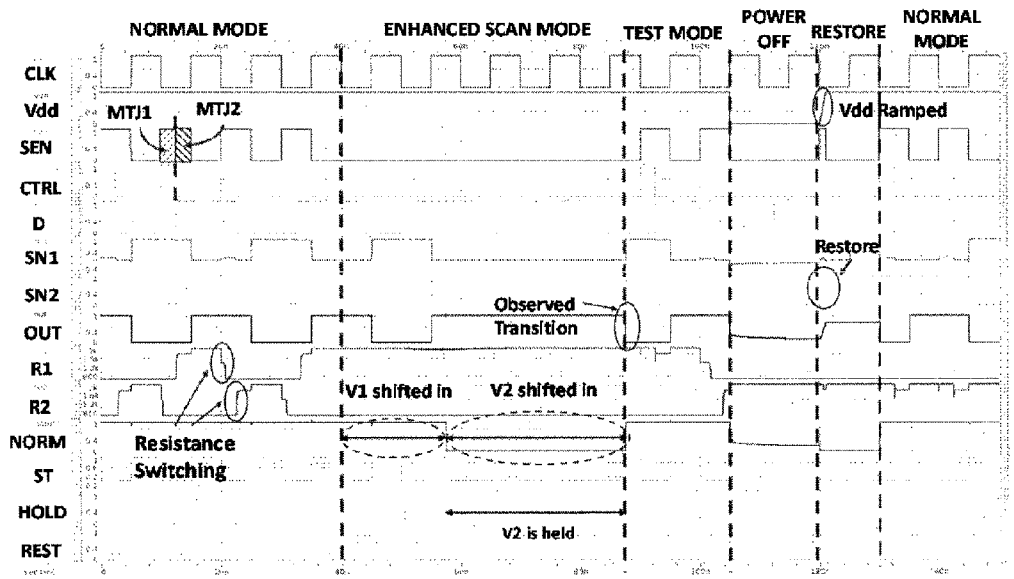
FIG. 2(b) shows a timing diagram describing various operation modes of the base ES-NVFF circuitry of FIG. 2(a), according to an embodiment of the present invention.

In the normal mode operation of the base ES-NVFF circuitry 200 as shown in FIG. 2(b), both the HOLD and REST signals are set low to set the ST signal which is also controlled by the CLK signal, enabling the transmission gate T1 and disabling the transmission gate T2 that is controlled by the HOLD signal. Then, data from the master latch is fed to both slave latch and the NV latch. An output Q of the base ES-NVFF circuitry 200 is driven by the slave latch. While the slave latch pushes data out, the data are in parallel stored into MTJ1 and MTJ2 of the NV latch by using the control signals SEN and CTRL.

In the store mode operation of the base ES-NVFF circuitry 200 as show in FIG. 2(b), the signal SEN is enabled and activates the access transistors 210 and 220 during a negative phase of the CLK signal. The CTRL signal is pulsed high for half of the time during which the SEN signal is enabled to enable a write of MTJ1 and MTJ2 with '0' node voltages SN1 and SN2, respectively.

Referring to FIG. 2(b), a timing diagram illustrating switching operations of resistance R1 of MTJ1 and resistance R2 of MTJ2 in a store mode operation is shown, according to an embodiment of the present invention.

Figure 3A:
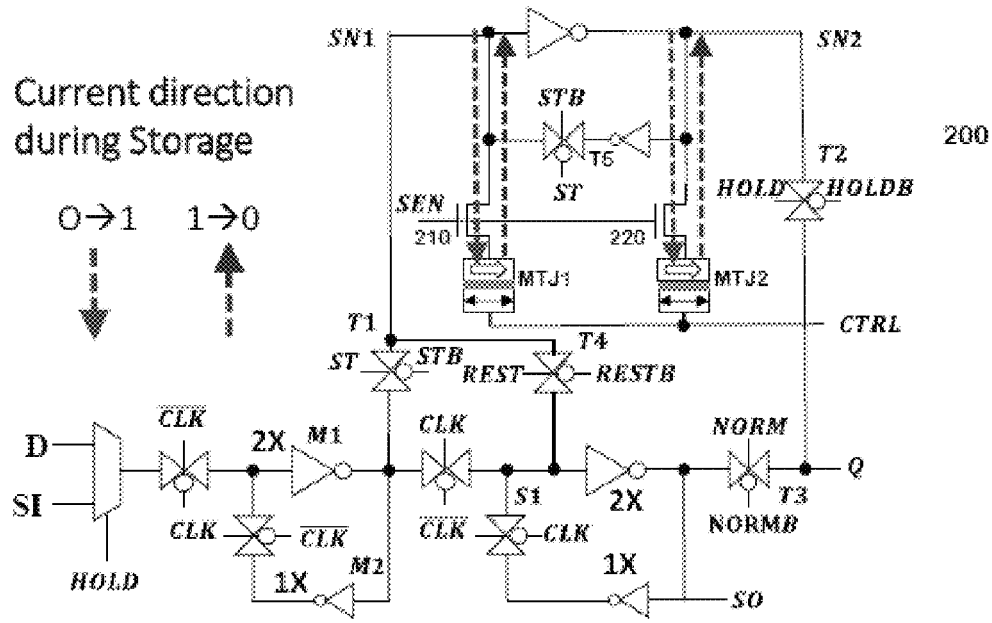
FIG. 3(a) shows a schematic diagram of the base ES-NVFF circuitry of FIG. 2(a) with current paths during a store operation, according to an embodiment of the present invention.

The current paths for switching the magnetization of the MTJs with respect to their node voltages SN1 and SN2 are illustrated in FIG. 3(a). Referring to FIG. 3(a), a first voltage difference can be generated between a voltage of the CTRL signal and the node voltage SN1 for MTJ1 and a second voltage difference can be generated between a voltage of the CTRL signal and the node voltage SN2 for MTJ2, providing currents to switch magnetization states of MTJ1 and MTJ2, respectively.

Specifically, the transition from AP magnetization state to P magnetization state is shown in FIG. 2(b). In the next half phase, the CTRL signal can be set low to enable MTJ1 and MTJ2 with '1' node voltages SN1 and SN2 to generate currents that switch the magnetization states to '1', respectively.

The switching of the resistance R2 of MTJ2 can be initiated after the switching of the resistance R1 of MTJ1 is finished. As a result, the store mode operations of MTJ1 and MTJ2 can be accomplished sequentially. Thus, operational frequencies of MTJ1 and MTJ2 of the NV latch can depend upon write latency. This is different from a sequential element circuitry in which operational frequencies are determined by delays of combinational logics of the circuitry.

Moreover, FIG. 2(b) shows waveforms of an enhanced scan mode operation of the base ES-NVFF circuitry 200. A test pattern V1 is first shifted into the NV latch by a scan-out (SO) chain. The HOLD signal is then asserted, pulling the NORM signal down to '0' such that the transmission gate T3 is disabled and the transmission gate T2 is enabled. Then an output is driven by the NV latch while a second test pattern V2 is scanned through a scan-in (SI) port and is shifted in the scan chain. Next, the HOLD signal is pulled down to '0' and the two-pattern transition is injected into the combinational logics of the base ES-NVFF circuitry 200. Since a test clock generally runs at a rate much slower than that of a functional clock, the MTJ write latencies are not critical for performance of the base ES-NVFF circuitry 200. It is noted that different clocks such as a system clock and a test clock can be used during normal mode and test mode, respectively. Moreover, a common clock can be used in both normal flop mode and enhanced scan latch mode. The selection from different clocks can be made with help of a multiplexer MUX. The test clock can be selected only during the test mode when the 'HOLD' signal is asserted. The store and restore operation can be performed during normal mode without asserting the 'HOLD' signal. Therefore, the transmission gates of enhanced scan latch can be controlled by the system clock. When the enhanced scan latch can be activated in the test mode by asserting the HOLD signal, the test clock can be selected for the scan, hold and latch operations.

It is also noted that the MTJs get written during the test mode as well. This may not be an issue since the test clock is generally slower than the normal clock. In other words, the store operation can be performed every cycle (not only before power-off) seamlessly, without switching between the normal clock and the test clock.

Figure 3B:
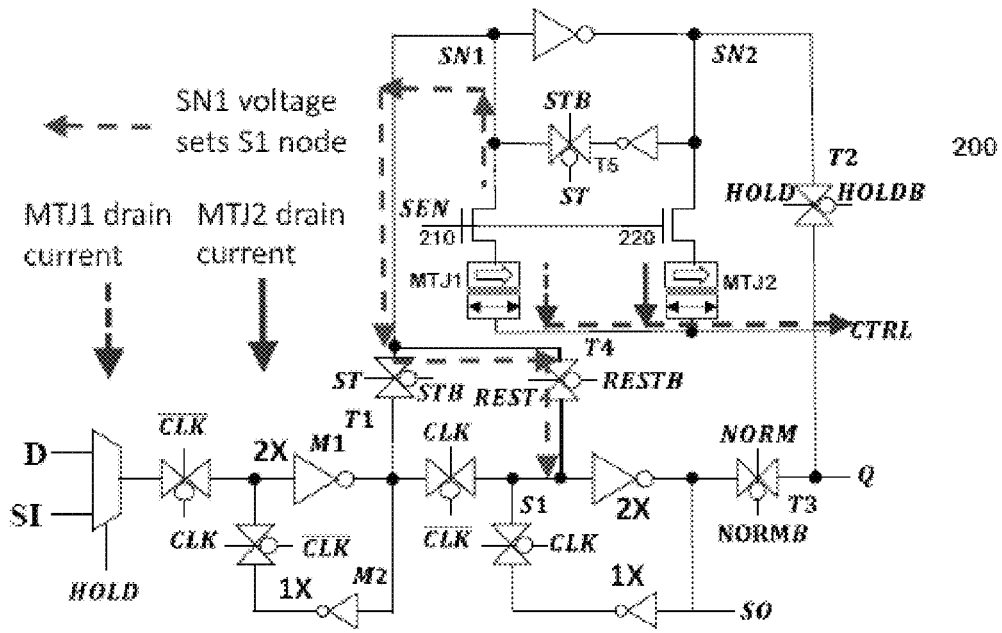
FIG. 3(b) shows a schematic diagram of the base ES-NVFF circuitry of FIG. 2(a) with current paths during a restore operation, according to an embodiment of the present invention.

In the restore mode operation of the base ES-NVFF circuitry 200 as shown in FIG. 3(b) with illustration of current flow paths, initially, a power supply Vdd and the SEN signal are ramped up while maintaining a low CLK signal. Due to a difference between resistances of MTJ1 and MTJ2 when switching between the opposite magnetization states of MTJ1 and MTJ2, the respective current drivability of MTJ1 and MTJ2 can be different accordingly. As the node voltages SN1 and SN2 rise, the voltages are being drained through the resistances of MTJ1 and MTJ2, respectively. Due to a difference in the resistances of current paths, a mismatch in the currents is generated, which in turn leads to a voltage difference between SN1 and SN2, enabling the back-to-back inverters 230 and 240 to latch to corresponding logic states as shown in FIG. 2(a). Once latched, the transmission gate T4 is activated with a high REST signal to set the slave latch node voltage S11 as shown in FIG. 3(b) with minimal contention, thus completing the restore operation.

Example 2: High Performance ES-NVFF (HPES-NVFF)

The base ES-NVFF circuitry 200 stores the data serially during the negative phases of CLK cycles. Since MTJ write is delay intensive, there may be limitations with the operation frequency of the base ES-NVFF circuitry 200.

Unlike the base ES-NVFF circuitry 200, the HPES-NVFF circuitry allows MTJ1 and MTJ2 to be written in parallel, thereby increasing the operation frequency.

Figure 4A:
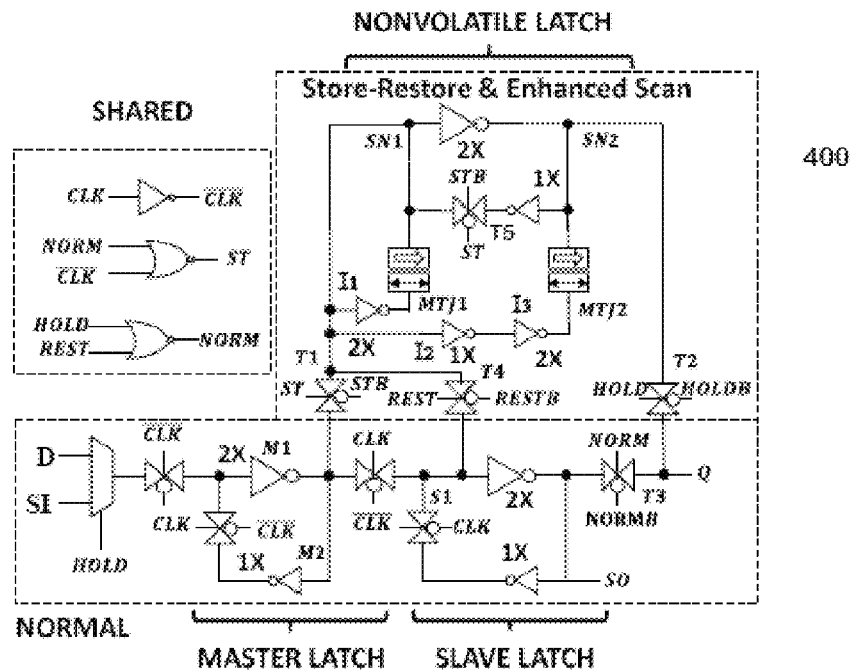
FIG. 4(a) shows a schematic diagram of a high performance enhanced scan flip-flops (HPES-NVFF) circuitry, according to an embodiment of the present invention.

FIG. 4(a) shows schematics of an HPES-NVFF circuitry 400 according to an embodiment of the present invention. In contrast to the base ES-NVFF circuitry 200, the access transistors 210 and 220 coupled to MTJ1 and MTJ2 and the CTRL signal controlling MTJ1 and MTJ2 can be removed from the HPES-NVFF circuitry 400. Moreover, output of the master latch can be used to drive MTJ1 and MTJ2 in the HPES-NVFF circuitry 400. As a result, a data input of the flip flops can replace the CTRL signal and the write operations of MTJ1 and MTJ2 can be performed in parallel.

Figure 4B:
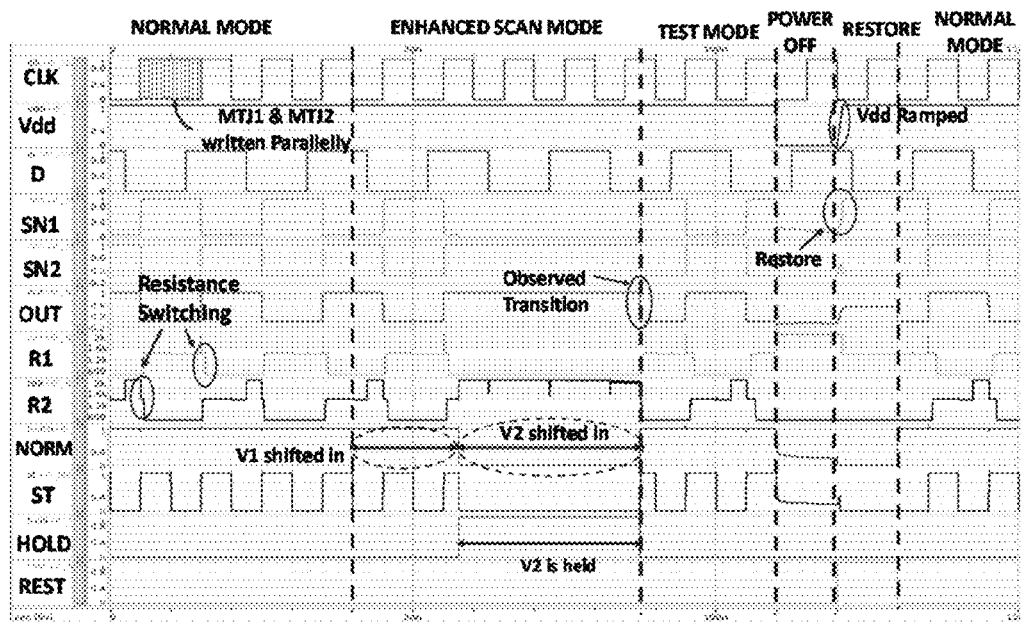
FIG. 4(b) shows a timing diagram describing various operation modes of the HPES-NVFF circuitry of FIG. 4(a), according to an embodiment of the present invention.
Figure 5:
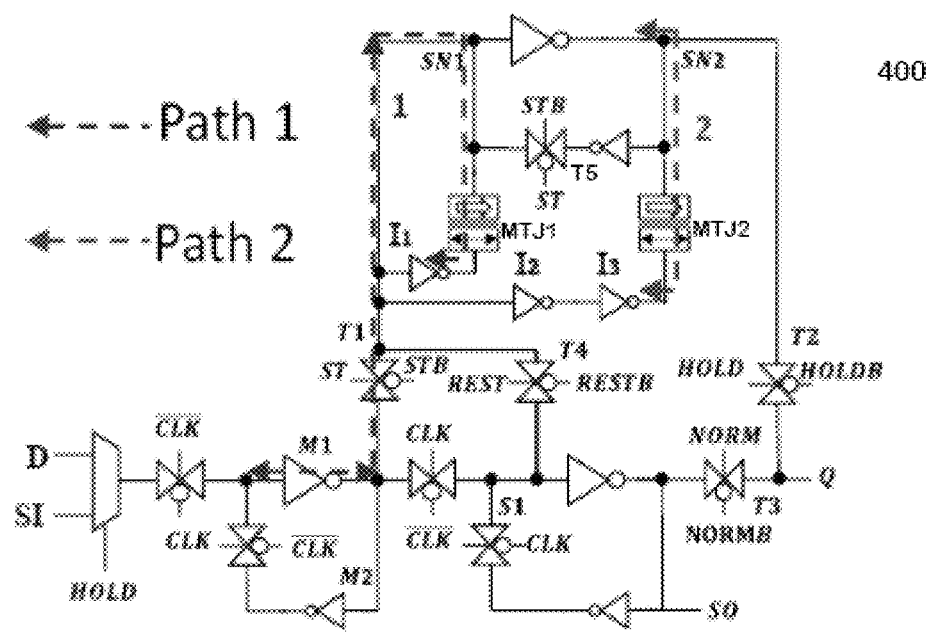
FIG. 5 shows a schematic diagram of the HPES-NVFF circuitry of FIG. 4(a) with current paths of operations of MTJ1 and MTJ2, according to an embodiment of the present invention.

The HPES-NVFF circuitry 400 can include inverters I1, I2, and I3 forming complementary inputs to MTJ1 and MTJ2. By providing separate write drivers to MTJ1 and MTJ2, the write operation of MTJ1 and MTJ2 can be performed during the entire CLK cycle. The timing diagram and switching of MTJ resistance is illustrated in FIG. 4(b). A similar functionality is observed as that of the base ES-NVFF. Moreover, both MTJs are written in parallel as shown in FIG. 4(b) upon receiving a new input when the CLK signal is high. Furthermore, by removing the access transistor, the resistance of the path 1 as shown in FIG. 5 is reduced, allowing a current increase up to five to eight times to flow into the MTJs with a corresponding sizing of the inverters such that the effective write time is reduced and the operation frequency is increased as a result.

As much as five times frequency benefit can be obtained with the HPES-NVFF 400 circuitry, comparing to the base ES-NVFF circuitry 200. A potential drawback associated with the HPES-NVFF circuitry may be extra area overhead due to the additional drivers.

Both the base ES-NVFF 200 and the HPES-NVFF 400 can store data in every clock cycle or back up data prior to a power gating by controlling the transmission gates T1, T2, T3, and T4.

Design Analysis of HPES-NVFF

An analysis of design metrics of the HPES-NVFF circuitry 400 according to an embodiment of invention can include analysis of the HPES-NVFF circuitry 400 with respect to supply voltage scaling and inherent asymmetry in write latency when switching between the magnetization states of MTJ1 and MTJ2, namely, parallel-to-antiparallel (P to AP) and antiparallel to parallel (AP to P) magnetizations. Impacts of static power during retention and a back-to-back writing of the same data according to an embodiment of invention can also be analyzed. Furthermore, an input dependent power gating technique can be used to mitigate the static power according to an embodiment of invention.

The asymmetry of write in the HPES-NVFF circuitry 400 can originate from two sources, (a) inherent asymmetry between P to AP and AP to P switching operations; and (b) the asymmetry in the driving circuits of MTJ1 and MTJ2. In particular, polarization of charge current during AP to P switching can be higher than during P to AP switching, making the write operation faster compared to P to AP switching. The operating frequency of the flip-flops can be determined by a worst case MTJ write latency. A thorough analysis and mitigation can be used to eliminate the frequency bottlenecks originating from the MTJ write latency.

In FIG. 5, the node voltage of SN1 can be maintained by a driving capability of an inverter of the master latch, the inverter generally having a relatively large size. MTJ1 and MTJ2 can be correspondingly written by two bi-directional currents flowing in the current path 1 and current path 2, respectively.

The current path 1 comprising $I_1$, $T_1$ and $M_1$ can be a critical current path due to the presence of multiplexers, resulting in increased path resistance and thus effectively reducing the overall write current. Moreover, the switching characteristics of MTJ1 and MTJ2 can be directly dependent on current magnetization states of a free layer with respect to a fixed layer of the MTJs, resulting in an asymmetry in writing. Therefore, the critical path delay can be affected by cumulative effects of a slower switching of MTJs from P to AP magnetization state and the difference in resistive current paths of MTJs.

Figure 6A:
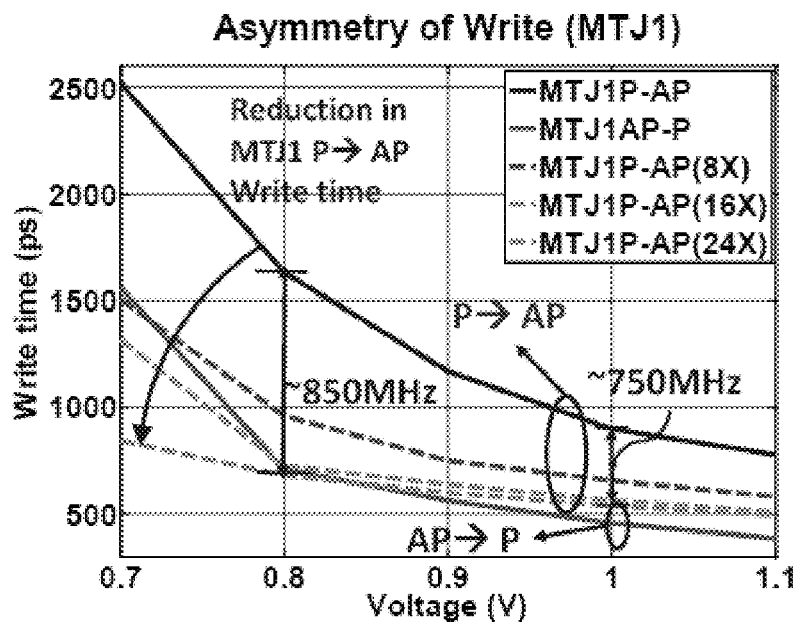
FIG. 6(a) is a graph showing write times of a first MTJ1 vs. supply voltages of the HPES-NVFF circuitry of FIG. 4(a), according to an embodiment of the present invention.

FIGS. 6(a) and (b) show impacts of magnetization switching times of AP to P and switching time of P to AP with respect to supply voltages for MTJ1 and MTJ2, respectively. A verilogA model of MTJs incorporating factors of polarization differences between state switching from P to AP and state switching from AP to P can be used for circuit simulation.

Referring to FIG. 6(a), the solid line represents the switching time for MTJ1 with 1× transistor size to switch from P to AP. In order to bridge the gap between the switching times between the magnetizations states, sizes of the current path components can be carefully selected. To improve write current of the current path 1, the driving capability of the inverter of master latch can be enhanced by increasing a size of PMOS of the transmission gate T1 and a size of NMOS transistor of the inverter I1. In the current path 2, a size of PMOS of the inverter that drives node SN2 and a size of NMOS of the feedback inverter can both be increased.

Figure 6B:
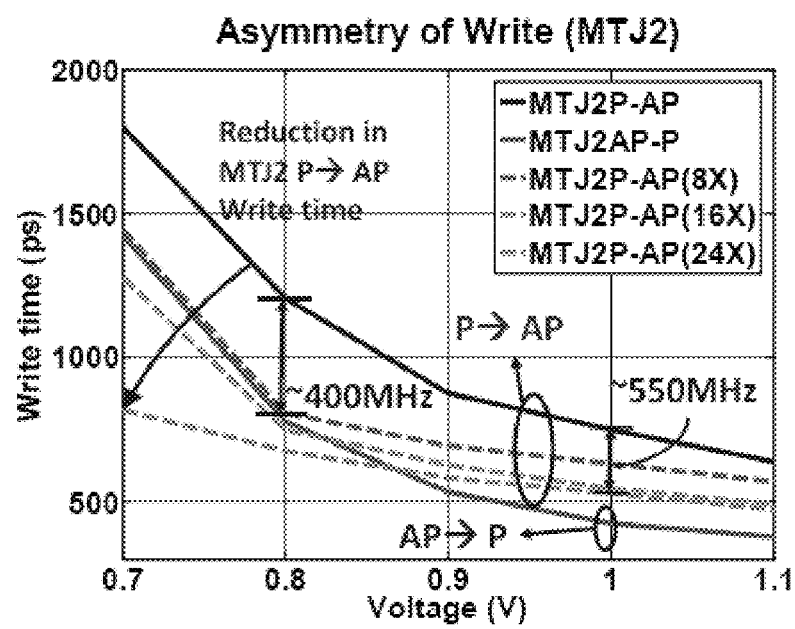
FIG. 6(b) is a graph showing write times of a second MTJ2 vs. supply voltages of the HPES-NVFF circuitry of FIG. 4(a), according to an embodiment of the present invention.

In FIG. 6(a), the dotted lines represent variations of the write time from P to AP of MTJ1 for 8×, 16× and 24× transistor sizes, respectively. Similarly, in FIG. 6(b), the dotted lines represent variations of the write time from P to AP of MTJ2 for 8×, 16× and 24× transistor sizes, respectively.

A significant reduction of write time, for example, around 60%, can be accomplished when the transistor size is increased from 1× to 24×. Moreover, the gap between the write times of the two magnetization states, namely, switching from P to AP and switching from AP to P, can be dramatically reduced by about 81% at 1V and by about 103% at 0.8V. A similar increase of size can be performed for the current path 2 of MTJ2 such that near uniform write times for MTJ2 are achieved. In addition to the increase of transistor size, boosting supply voltages can also reduce the overall write time of MTJ1 and MTJ2. At a supply voltage of 0.7 V, an operating frequency of about 0.75 GHz can be obtained. A supply voltage of 1.1 V allows the HPES-NVFF circuitry to operate at a frequency of about 2 GHz with 16× transistor sizes.

Example 3: Power Gating Circuitry and Scheme

To reduce or eliminate the static current and unnecessary write power, a data-dependent power-gated high performance enhanced scan NVFF (PGHPES-NVFF) circuitry and scheme according to an embodiment of the present invention can be used.

Figure 8:
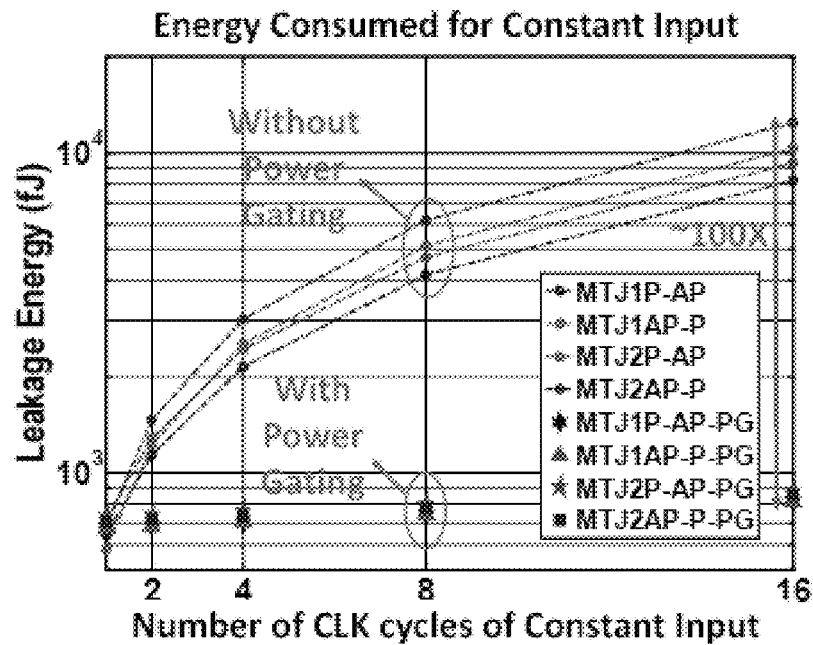
FIG. 8 shows a comparison of short circuit leakage energies of the HP-ES-NVFF circuitry of FIG. 4(a) with the PGHPES-NVFF circuitry of FIG. 7(a), according to an embodiment of the present invention.

Referring to FIG. 8, upon completion of the write operations for MTJ1 and MTJ2, a high branch current can continue to flow, leading to a large amount of short circuit leakage current. This does not only increase the power consumed but also can degrade the lifetime of the MTJs. Moreover, infrequent switching of the input can consume static power even when the MTJs are not written with new values.

Figure 7A:
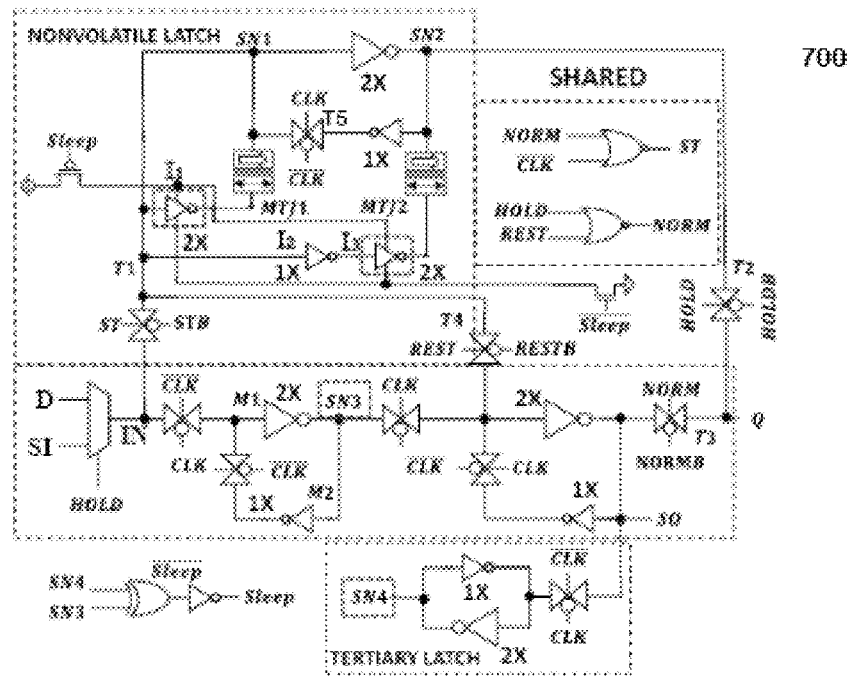
FIG. 7(a) shows a schematic diagram of a power-gating high performance enhanced scan flip-flops (PGHPES-NVFF) circuitry, according to an embodiment of the present invention.

In order to efficiently cut down the unnecessary static power, the power-gated HPES-NVFF (PGHPES-NVFF) circuitry and scheme can employ a power gating technique to shut off the inverters I1 and I3 when there is no change in the input of the circuitry, as shown in FIG. 7(a). This can be achieved by comparing a current state of the circuitry with a previous state of the circuitry. If states are unchanged, the write drivers are disconnected from the supply voltage using gating transistors.

In FIG. 7(a), the power-gated HPES-NVFF (PGHPES-NVFF) circuitry 700 differs from the HPES-NVFF circuitry 400 in that a tertiary latch can be incorporated into the power-gated HPES-NVFF (PGHPES-NVFF) circuitry 700 to compare the difference between previous and current states of the circuitry and also the NV latch can be shifted to be coupled to the master latch at a point between a multiplexer and a transmission gate of the master latch.

Figure 7B:
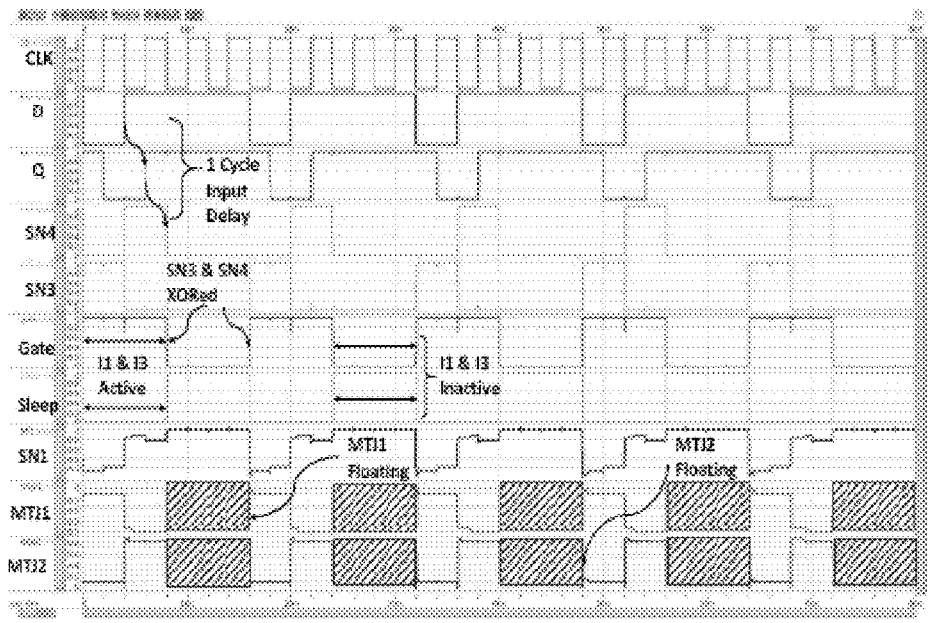
FIG. 7(b) shows a timing diagram illustrating gating processes of the PGHPES-NVFF circuitry of FIG. 7(a), according to an embodiment of the present invention.

The tertiary latch can be connected in series to the slave latch in order to provide one cycle delay between the states being compared, such that the NV latch has one whole cycle to store the input in MTJ1 and MTJ2, respectively, as shown in FIG. 7(b). The gating transistors can be controlled by a Sleep signal. The Sleep signal can be obtained by XOR-ing node voltages SN4 and SN3, first at the previous voltage state and then at the current voltage state.

Referring to FIG. 7(b), the Sleep signal is only active for one CLK cycle when there is a mismatch between the node voltages SN4 and SN3. When the input remains unchanged, the node voltages of MTJ1 and MTJ2 are floating, thereby disconnecting it from the current paths. Moreover, both PMOS and NMOS gating may be required due to bidirectional nature of the currents that flow through MTJ1 and MTJ2, depending on polarities of input data. One potential drawback of the PGHPES-NVFF circuitry 700 is that the XOR gate and the tertiary latch may add extra area overhead.

FIG. 8 shows quantitative effects of leakage energy of both switching operations from AP to P and from P to AP for MTJ1 and MTJ2 for back-to-back unchanged inputs for multiple CLK cycles. A significant reduction of almost 100 times in the short circuit leakage energy can be achieved with the PGHPES-NVFF circuitry 700 compared with the HPES-NVFF circuitry 400.

Table-I summarizes characteristics of the base ES-NVFF, HPES-NVFF, and PGHPES-NVFF circuitries.

It can be noted that the base ES-NVFF circuitry may require two control signals including one for the first and second access transistors 210 and 220 and the other for the MTJs for storing the corresponding data. Moreover, the storage operation can be performed serially by one MTJ after the other MTJ and can be performed only during the negative clock phases as shown in FIG. 2(b), resulting in a reduction in the operation frequency.

In the HPES-NVFF circuitry, the store operations occur in parallel and the entire clock cycle is utilized for writing data into the MTJs. However, a high current through the MTJs can be generated as a result, consuming high power and degrading lifetime of MTJs.

In order to reduce the static power, an input gating scheme is applied in the PGHPES-NVFF circuitry that uses a tertiary latch to hold previous data and to compare the previous data with the current data. If there is no change between the previous and current data, the feedback inverters can be disconnected from the power supply and thus can reduce or eliminate the static power.

It is also noted that read disturbances can be reduced or eliminated in the embodiments of the present invention. During the restore operation, the voltages at the nodes SN1 and SN2 are latched and the feedback inverters at the drain of the MTJs can reset the MTJs into their corresponding correct states. Once the latch is initialized to be same polarity as the MTJs, it can write the same polarity back thereby avoiding read disturbances. During the normal operation, once the store operation is done, the latch again can write the same polarity as stored value. As a result, the read disturbance is reduced or eliminated.

TABLE I

| Title | Base ES-NVFF | HPES-NVFF | PGHPES -NVFF |
|---|---|---|---|
| Main feature | With enhanced scan, no write driver | Parallel write, fewer control signals | Input gated to achieve low power consumption |
| Store Energy | 0.55 pJ@ 1.1 V | 0.57 pJ@ 1.1 V | 0.57 pJ@ 1.1 V |
| Restore Energy | 33 fJ | 58 fJ | 58 fJ |
| Timing | ~350 MHz | ~2 GHz | ~2 GHz |
| Power Gating | NO | NO | YES |
| Area | 1.8X (std FF) | 2X (std FF) | 2.5X (std FF) |
| Timing | ~350 MHz | ~2 GHz | ~2 GHz |
| C-to-Q delay | 30.9/33.5 ps | 28.9/32.1 ps | 31.2/33.8 |

Figure 9:
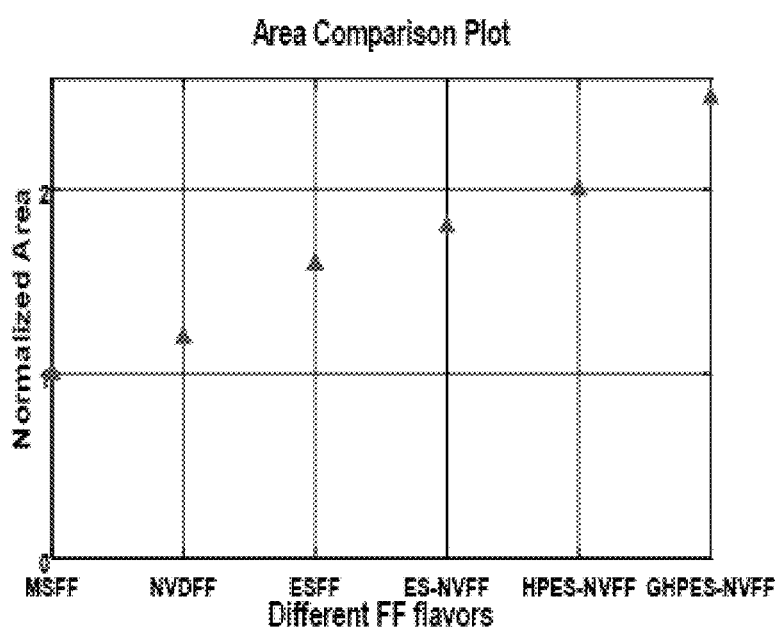
FIG. 9 shows a plot diagram illustrating a comparison of normalized areas of master/slave (MSFF), NVDFF, ES-NVFF, enhanced scan flip flops (ESFF), HPES-NVFF, and PGHPES-NVFF circuitries with respect to the area of the MSFF circuitry, according to embodiments of the present invention.

The normalized areas of the base ES-NVFF circuitry 200, the HPES-NVFF circuitry 400, the PGHPES-NVFF circuitry 700, a nonvolatile D flip flop (NVDFF) circuitry, and an enhanced scan flip flop (ESFF) circuitry are compared with respect to a master-slave flip flop (MSFF) circuitry, in FIG. 9. The layouts are designed under 0.5-μm standard CMOS rules. Although cell area of the base ES-NVFF circuitry 200 is about 1.8 times of that of the standard MSFF circuitry, non-volatility and enhanced scan functionalities were successfully achieved by a SPICE simulation. By implementing a parallel write operation with an area of 2 times, a performance benefit of up to 2 GHz was achieved by the HPES-NVF circuitry 400. With addition of the XOR gates, an inverter, and gating transistors, a significant reduction in leakage energy was achieved by the PGHPES-NVFF circuitry 700. The corresponding area overhead of the PGHPES-NVFF circuitry 700 was about 1.56 times compared to that of the ESFF circuitry and 2.5 times compared to that of the MSFF circuitry.

Several NVFF embodiments of the present invention that are capable of backing up data per cycle while maintaining a moderately low delay along with delay testing capability are presented above. The effects of supply voltage scaling, asymmetry of writing of the MTJs, and the impacts of static leakage power are analyzed using a 22 nm predictive model. Table-II below provides a summary of comparisons of the NVFFs of various embodiments of the present invention with respect to other flip flop (FF) circuitries with respect to the above mentioned characteristics. Table-II includes flip-flop performance metrics such as clock-to-Q delay, critical path delay limited by MTJ write time, and total cycle time. Table-II also includes store energy, area, and other characteristics such as enhanced scan capability and power gating for saving store energy when flip-flop data is same as input data. The present invention not only provides test capability and power gating, but also allows data storage in every cycle with a maximum operation frequency of about 2 GHz. These characteristics allow data recovery at unexpected power failures and provide an instant-ON user experience.

TABLE II

| Title | NV-DFF[1] | SHE-NVFF[2] | Spin-MTJNVFF[3] | NMFF [4] | Power Gated HP ES-NVFF |
|---|---|---|---|---|---|
| Technology | 65 nm | NA | 90 nm | 65 nm | 22 nm predictive[9] |
| Main feature | Power-aware bias-control | No write driver, small area | Low power, small area | Magnetic field based MTJ | Parallel write, fewer control signals |
| Store energy | 0.304 pJ | 0.49 pJ/ | 5 pJ | 1.5 pJ | 0.57 pJ@1.1 V |
| Power gating | NA | NA | NA | NA | YES |
| Area | 1.2X (std FF) | 1.28X (std FF) | 5.65 um × 10.15 um | NA | 2X (std FF) MTJ = 10X10 nm |
| Clock period | 10 ns | 10.91 ns & 18.54 ns | 3.3 GHz | 3.5 GHz | ~2 GHz |

TABLE II-continued

| Title | NV-DFF[1] | SHE-NVFF[2] | Spin-MTJNVFF[3] | NMFF [4] | Power Gated HP ES-NVFF |
|---|---|---|---|---|---|
| Critical path | 4 ns for MTJ switching | 29.45 ns | ~300 ps | Only during data store | Dependent on MTJ write time (<1ns) |
| C-to-Q delay | 93 ps | NA | 300 ps | NA | 28.9/32.1 ps |
| Test capability | NO | NO | NO | NO | YES |

NA—Not Available

Embodiments of the present invention offer fast data store and restoration, for example, within a single clock cycle, when there is an intentional or unintentional power outage. These embodiments also provide enhanced scan functionality needed for a two-pattern delay testing. Since input from the master latch can be stored in the MTJs, needs for an external control and a driver circuitry can be reduced or eliminated. In particular, the HPES-NVFF circuitry can utilize an entire CLK cycle for the backup operation and thus eliminate a frequency bottleneck originating from MTJ write latencies. Asymmetry of MTJ write latencies and high static power are also presented. A power gating circuitry and scheme can be utilized to ensure low-power and robust operation.

It should be understood that the examples and embodiments described herein are for illustrative purposes only and that various modifications or changes in light thereof will be suggested to persons skilled in the art and are to be included within the spirit and purview of this application. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

All patents, patent applications, provisional applications, and publications referred to or cited herein (including those in the "References" section) are incorporated by reference in their entirety, including all figures and tables, to the extent they are not inconsistent with the explicit teachings of this specification.

REFERENCES

[1] Yamamoto, Shuu'ichirou, and Satoshi Sugahara. "Nonvolatile delay flip-flop based on spin-transistor architecture and its power-gating applications." Japanese Journal of Applied Physics 49.9R (2010): 090204.
[2] Kwon, K-W., et al. "SHE-NVFF: spin Hall effect-based nonvolatile flip-flop for power gating architecture." (2014): 1-1.
[3] Zhao, Weisheng, Eric Belhaire, and Claude Chappert. "Spin-mtj based non-volatile flip-flop." Nanotechnology, 2007. IEEE-NANO 2007. 7th IEEE Conference on. IEEE, 2007.
[4] Sakimura, Noboru, et al. "Nonvolatile magnetic flip-flop for standby-power-free SoCs." Solid-State Circuits, IEEE Journal of 44.8 (2009): 2244-2250.
[5] Goel, Ashish, et al. "Low-overhead design of soft-error-tolerant scan flip-flops with enhanced-scan capability." Design Automation, 2006. Asia and South Pacific Conference on. IEEE, 2006.
[6] Fong, Xuanyao, et al. "KNACK: A hybrid spin-charge mixed-mode simulator for evaluating different genres of spin-transfer torque MRAM bit-cells." Simulation of Semiconductor Processes and Devices (SISPAD), 2011 International Conference on. IEEE, 2011.
[7] Zhang, Yaojun, et al. "Asymmetry of MTJ switching and its implication to STT-RAM designs." Proceedings of the Conference on Design, Automation and Test in Europe. EDA Consortium, 2012.
[8] Khan, Ayaz Arif, et al. "Dielectric breakdown in Co—Fe—B/MgO/Co—Fe—B magnetic tunnel junction." Journal of Applied Physics 103.12 (2008): 123705.
[9] Predictive technology model, http://ptm.asu.edu/
[10] S. Srinivasan, "All spin logic: Modeling multi-magnet networks interacting via spin currents". PhD diss., Purdue University, 2012.
[11] Chabi, D., Zhao, W., Deng, E., Zhang, Y., Ben Romdhane, N., Klein, J. O., and Chappert, C. "Ultra low power magnetic flip-flop based on checkpointing/power gating and self-enable mechanisms." Circuits and Systems I: Regular Papers, IEEE Transactions, 61 (6), 1755-1765.

What is claimed is:

1. A nonvolatile flip-flop apparatus, comprising:
a master latch;
a slave latch coupled to the master latch; and
a nonvolatile (NV) latch coupled to the master latch,
wherein the master latch provides inputs to the slave latch and the NV latch,
wherein the NV latch comprises:
a first current path including a first magnetic tunnel junction (MTJ); and
a second current path including a second MTJ,
wherein the first current path and the second current path are coupled in parallel by a plurality of back-to-back inverters,
wherein the nonvolatile flip-flop apparatus further comprises:
a first access transistor coupled to the first in series; and
a second access transistor coupled to the second MTJ in series, and
wherein the first access transistor and the second access transistor are respectively controlled by a set of shared signals.

2. The nonvolatile flip-flop apparatus according to claim 1, wherein the set of shared signals are configured to control a plurality of operation modes of the NV latch including a normal mode, an enhanced scan mode, a store mode, and a restore mode.

3. The nonvolatile flip-flop apparatus according to claim 2, wherein during the normal mode the set of shared signals are configured such that data from the master latch are fed to both the slave latch and the NV latch, and when the slave latch pushes output data out the output data are in parallel stored into the first MTJ and the second MTJ.

4. The nonvolatile flip-flop apparatus according to claim 2, wherein during the store mode the set of shared signals are configured to control the first access transistor and the second access transistor in a synchronized manner such that switching of resistance of the second MTJ is initiated after switching of resistance of first MTJ is finished.

5. The nonvolatile flip-flop apparatus according to claim 2, wherein during the restore mode an external power supply and the set of shared signals are configured such that the back-to-back inverters are correspondingly latched and then a node voltage of the slave latch is set to complete the restore mode.

6. The nonvolatile flip-flop apparatus according to claim 2, wherein during the enhanced scan mode a test pattern is first shifted into the NV latch by a scan-out (SO) chain, the set of shared signals are configured such that an output is driven by the NV latch while a second test pattern is scanned through a scan-in (SI) port and is shifted in, and then the set of shared signals are further configured such that transitions of the two test patterns are injected into combinational logics of the nonvolatile flip-flop apparatus.

7. A nonvolatile flip-flop apparatus, comprising:
a master latch;
a slave latch coupled to the master latch; and
a nonvolatile (NV) latch coupled to the master latch,
wherein the master latch provides inputs to the slave latch and the NV latch,
wherein the NV latch comprises:
a first current path including a first magnetic tunnel junction (MTJ);
a second current path including a second MTJ; and
a plurality of inverters providing complementary inputs to the first and second MTJs,
wherein the first current path and the second current path are coupled in parallel by a plurality of back-to-back inverters, and
wherein the plurality of inverters includes a first inverter coupled to the first MTJ, and second and third inverters coupled in series and coupled to the second MTJ.

8. The nonvolatile flip-flop apparatus according to claim 7, wherein the first MTJ and the second MTJ are configured to be written in parallel for increasing an operation frequency of the nonvolatile flip-flop apparatus.

9. The nonvolatile flip-flop apparatus according to claim 7, further comprising a tertiary latch.

10. The nonvolatile flip-flop apparatus according to claim 9, wherein the tertiary latch is configured to compare a difference between a previous state and a current state of the nonvolatile flip-flop apparatus.

11. The nonvolatile flip-flop apparatus according to claim 10, wherein the tertiary latch is configured such that the nonvolatile flip-flop apparatus has at least one whole cycle to store inputs in the first and second MTJs.

12. The nonvolatile flip-flop apparatus according to claim 10, wherein at least one inverter of the plurality of inverters is shut off when there is no change in inputs of the nonvolatile flip-flop apparatus.

13. The nonvolatile flip-flop apparatus according to claim 10, wherein a current state and a previous state of the nonvolatile flip-flop apparatus are compared and, if the states compared are the same, write drivers of the first and second MTJs are disconnected from a supply voltage of the nonvolatile flip-flop apparatus by a gating transistor.

14. A method for nonvolatile storage of a logical state of a flip-flop output, comprising:
coupling a master latch to a slave latch; and
coupling a nonvolatile (NV) latch to the master latch,
wherein the master latch provides inputs to the slave latch and the NV latch,
wherein the NV latch comprises:
a first current path including a first magnetic tunnel junction (MTJ); and
a second current path including a second MTJ,
wherein the first current path and the second current path are coupled in parallel by a plurality of back-to-back inverters,
wherein the method further comprises:
coupling a first access transistor to the first MTJ in series; and
coupling a second access transistor to the second MTJ in series, and
wherein the first access transistor and the second access transistor are respectively controlledd by a set of shared signals.

15. The method of claim 14, wherein the set of shared signals are configured to control a plurality of operation modes of the NV latch including a normal mode, an enhanced scan mode, a store mode, and a restore mode.

16. The method of claim 14, further comprising coupling a plurality of inverters providing complementary inputs to the first and second MTJs, wherein the plurality of inverters includes a first inverter coupled to the first MTJ, and second and third inverters coupled in series and coupled to the second MTJ.

17. The method of claim 14, further comprising coupling a tertiary latch to the NV latch, wherein the tertiary latch is configured to compare a difference between a previous state and a current state of the NV latch.

\* \* \* \* \*

UNITED STATES PATENT AND TRADEMARK OFFICE
CERTIFICATE OF CORRECTION

PATENT NO. : 9,728,241 B2  
APPLICATION NO. : 15/144322  
DATED : August 8, 2017  
INVENTOR(S) : Swaroop Ghosh, Anirudh Srikant Iyengar and Jae-Won Jang Page 1 of 1

It is certified that error appears in the above-identified patent and that said Letters Patent is hereby corrected as shown below:

On the Title Page

Item (54) and in the Specification, Column 1, Line 2, "ENHANCED-SCAN" should read --ENHANCED SCAN--.

In the Specification

Column 1,
Line 12, "Grant Numb CNS1441757" should read --Grant Number CNS1441757--.

Column 2,
Line 6, "s store mode," should read --a store mode,--.

Column 6,
Line 27, "voltage S11" should read --voltage S1--.

Column 9,
Line 46, "TABLE I" should read --TABLE-I--.

Column 10,
Line 53, "TABLE II" should read --TABLE-II:--.
TABLE-II, "0.49 pJ/" should read --0.49 pJ--.

Column 12,
Line 51, "coupled to the first in" should read --coupled to the first MTJ in--.

Signed and Sealed this  
Third Day of July, 2018

Andrei Iancu  
*Director of the United States Patent and Trademark Office*